US012727284B2

(12) United States Patent
Yao et al.

(10) Patent No.: US 12,727,284 B2
(45) Date of Patent: Sep. 1, 2026

(54) LIGHT-EMITTING DIODE EPITAXIAL WAFER, GROWTH METHOD THEREFOR, AND LIGHT-EMITTING DIODE CHIP

(71) Applicant: HC SEMITEK (SUZHOU) CO., LTD., Jiangsu (CN)

(72) Inventors: Zhen Yao, Jiangsu (CN); Ying Cong, Jiangsu (CN); Binzhong Dong, Jiangsu (CN); Peng Li, Jiangsu (CN)

(73) Assignee: HC Semitek (Suzhou) Co. Ltd., Jiangsu (CN)

( * ) Notice: Subject to any disclaimer, the term of this patent is extended or adjusted under 35 U.S.C. 154(b) by 804 days.

(21) Appl. No.: 18/009,655

(22) PCT Filed: Jun. 4, 2021

(86) PCT No.: PCT/CN2021/098252

§ 371 (c)(1),
(2) Date: Aug. 18, 2023

(87) PCT Pub. No.: WO2021/249291

PCT Pub. Date: Dec. 16, 2021

(65) Prior Publication Data

US 2024/0120434 A1 Apr. 11, 2024

(30) Foreign Application Priority Data

Jun. 11, 2020 (CN) ......................... 202010530055.9

(51) Int. Cl.
*H10H 20/01* (2025.01)
*H10H 20/812* (2025.01)
*H10H 20/825* (2025.01)

(52) U.S. Cl.
CPC .... *H10H 20/01335* (2025.01); *H10H 20/812* (2025.01); *H10H 20/825* (2025.01)

(58) Field of Classification Search
None
See application file for complete search history.

(56) References Cited

U.S. PATENT DOCUMENTS

2003/0019239 A1* 1/2003 Levitin ................. F25B 41/385 62/197
2011/0212559 A1* 9/2011 Ohmae ............ H01L 21/02458 438/46

(Continued)

FOREIGN PATENT DOCUMENTS

CN 101488548 A 7/2009
CN 103022302 A 4/2013
CN 111430515 A 7/2020

OTHER PUBLICATIONS

HC Semitek (Suzhou) Co., Ltd., International Search Report and Written Opinion, PCTCN2021098252, Sep. 9, 2021, 13 pgs.

(Continued)

*Primary Examiner* — Bradley Smith
(74) *Attorney, Agent, or Firm* — Morgan, Lewis & Bockius LLP

(57) ABSTRACT

This application is directed to a light-emitting diode epitaxial wafer, a growth method therefor, and a light-emitting diode chip. The growth method comprises: placing a sapphire substrate into a reaction chamber; introducing a reaction gas into the reaction chamber; forming GaN crystal nuclei containing In atoms on the sapphire substrate; growing at least one composite layer on the GaN crystal nuclei, the GaN crystal nuclei growing to form a buffer layer, each composite layer comprising an InGaN sublayer and a GaN sublayer; and successively growing an N-type GaN layer, an active layer and a P-type GaN layer on the buffer layer to form an epitaxial wafer, the active layer comprising alternately stacked InGaN quantum wells and GaN quantum barriers. Large and stable GaN crystal nuclei are formed to (Continued)

effectively counteract stress generated by lattice mismatch between the sapphire substrate and a GaN-based material.

20 Claims, 2 Drawing Sheets

(56) References Cited

U.S. PATENT DOCUMENTS

| | | | | |
|---|---|---|---|---|
| 2015/0036117 | A1 | 2/2015 | Menon et al. | |
| 2018/0198029 | A1 | 7/2018 | Munteanu et al. | |
| 2019/0198623 | A1 * | 6/2019 | Yue | H10D 30/475 |
| 2020/0135970 | A1 | 4/2020 | Dasgupta et al. | |

OTHER PUBLICATIONS

HC Semitek (Suzhou) Co., Ltd., International Preliminary Report on Patentability, PCTCN2021098252, Dec. 13, 2022, 9 pgs.

* cited by examiner

LIGHT-EMITTING DIODE EPITAXIAL WAFER, GROWTH METHOD THEREFOR, AND LIGHT-EMITTING DIODE CHIP

CROSS-REFERENCE TO RELATED APPLICATIONS

This present disclosure application is a United States National Stage Application filed under 35 U.S.C. § 371 of PCT Patent Application Serial No. PCT/CN2021/098252, filed on Jun. 4, 2021, which claims the benefit of priority to Chinese Patent Application No. 202010530055.9, filed on Jun. 11, 2020, entitled "METHOD FOR GROWING LIGHT-EMITTING DIODE EPITAXIAL WAFER AND LIGHT-EMITTING DIODE EPITAXIAL WAFER", all of which are incorporated herein by reference in their entirety.

FIELD

The present disclosure relates to the field technical of semiconductors, and in particular, to a light-emitting diode epitaxial wafer, a growth method therefor and a light-emitting diode chip.

BACKGROUND

Light-emitting Diode (LED for short) is a semiconductor electronic element that can emit light. As an efficient, environmentally friendly, new green solid-state lighting source, LED is a new-generation light source that holds great promise, and is rapidly and widely used in such fields as traffic lights, interior and exterior automotive lights, urban landscape lighting, indoor and outdoor displays and small spacing displays.

Epitaxial wafers are primary products in the LED manufacturing process. In related technologies, a LED epitaxial wafer comprises a sapphire substrate, and a GaN buffer layer, an N-type GaN layer, an active layer formed by InGaN quantum wells and GaN quantum barriers stacked alternately, and a P-type GaN layer successively stacked on the sapphire substrate. The sapphire substrate is used to provide a surface for epitaxial growth, the GaN buffer layer is used to provide a nucleation center for epitaxial growth, the N-type GaN layer is used to provide electrons for recombination light emission, the P-type GaN layer is used to provide holes for recombination light emission, and the GaN quantum barriers confine the electrons and the holes in the InGaN quantum wells for recombination light emission.

Due to large lattice mismatch between the sapphire substrate and a GaN-based material, line defects generated by the lattice mismatch will extend to the active layer, which will affect the recombination light emission of the electrons and the holes, and accordingly reduce light-emitting efficiency of the LED.

SUMMARY

Embodiments of the present disclosure provide a light-emitting diode epitaxial wafer, a growth method therefor and a light-emitting diode chip, which can improve the stability of GaN crystal nuclei, and facilitate to reduce the line defects generated by lattice mismatch between a sapphire substrate and a GaN base material. The technical solution is as follows:

In one aspect, an embodiment of the present disclosure provides a growth method for a light-emitting diode epitaxial wafer, the growth method comprises:

- placing a sapphire substrate into a reaction chamber;
- introducing a reaction gas into the reaction chamber, and forming a plurality of GaN crystal nuclei containing In atoms on the surface of the sapphire substrate;
- growing at least one composite layer on the GaN crystal nuclei, the GaN crystal nuclei growing to form a buffer layer, and each composite layer comprising an InGaN sublayer and a GaN sublayer that is grown on the InGaN sublayer; and
- successively growing an N-type GaN layer, an active layer and a P-type GaN layer on the buffer layer to form an epitaxial wafer, the active layer comprising alternately stacked InGaN quantum wells and GaN quantum barriers.

Optionally, the step of introducing the reaction gas into the reaction chamber and forming the GaN crystal nuclei containing the In atoms in a partial region of the sapphire substrate comprises:

- introducing a Ga source and an N source into the reaction chamber, and Ga atoms and N atoms aggregating within the partial region of the sapphire substrate to form a plurality of first GaN crystal nuclei arranged at intervals;
- introducing an In source into the reaction chamber, and the In atoms being adsorbed on the first GaN crystal nuclei such that the first GaN crystal nuclei are enlarged to be second GaN crystal nuclei;
- introducing the Ga source and the N source into the reaction chamber, and a GaN layer generated by the reaction of Ga atoms and N atoms being clad onto the second GaN crystal nuclei to form the GaN crystal nuclei.

Optionally, a height of the first GaN crystal nuclei is 8 nm~15 nm.

Optionally, in forming the second GaN crystal nuclei, a duration time for introducing the In source is 10 s~50 s.

Optionally, a thickness of the GaN layer is 5 nm~10 nm.

Optionally, the step of growing the at least one composite layer on the GaN crystal nuclei, the GaN crystal nuclei growing to form the buffer layer, and the composite layer comprising the InGaN sublayer and the GaN sublayer that is grown on the InGaN sublayer comprises:

- introducing an In source, a Ga source and an N source into the reaction chamber, and a first InGaN sublayer generated by the reaction of In atoms, Ga atoms and N atoms being clad onto the GaN crystal nuclei;
- introducing the Ga source and the N source into the reaction chamber, and a first GaN sublayer generated by the reaction of Ga atoms and N atoms being clad onto the first InGaN sublayer;
- introducing the In source, the Ga source and the N source into the reaction chamber, and a second InGaN sublayer generated by the reaction of In atoms, Ga atoms and N atoms being clad onto the first GaN sublayer;
- introducing the Ga source and the N source into the reaction chamber, and a second GaN sublayer generated by the reaction of Ga atoms and N atoms being clad onto the second InGaN sublayer.

Optionally, thicknesses of the first InGaN sublayer, the first GaN sublayer, the second InGaN sublayer and the second GaN sublayer are reduced in order.

Optionally, the thickness of the first InGaN sublayer is 5 nm~10 nm, the thickness of the first GaN sublayer is 3 nm~8 nm, the thickness of the second InGaN sublayer is 2 nm 5 nm, and the thickness of the second GaN sublayer is 1 nm~4 nm.

Optionally, in generating the first InGaN sublayer and the second InGaN sublayer, flow rates of the In sources introduced are 50 sccm 500 sccm.

Optionally, the growth method further comprises:

before growing the N-type GaN layer on the buffer layer, growing an undoped GaN layer on the buffer layer.

In another aspect, an embodiment of the present disclosure provides a light-emitting diode epitaxial wafer, the light-emitting diode epitaxial wafer comprises a sapphire substrate, and a buffer layer, an N-type GaN layer, an active layer and a P-type GaN layer successively stacked on the sapphire substrate. The active layer comprises alternately stacked InGaN quantum wells and GaN quantum barriers. The buffer layer comprises a plurality of GaN crystal nuclei containing In atoms and at least one composite layer. The plurality of the GaN crystal nuclei are arranged on the surface of the sapphire substrate at intervals. The at least one composite layer is located on the plurality of the GaN crystal nuclei, and each composite layer comprises an InGaN sublayer and a GaN sublayer grown on the InGaN sublayer.

Optionally, the GaN crystal nuclei comprises a first GaN crystal nuclei, the In atoms and a GaN layer. The In atoms are laid on the first GaN crystal nuclei, and the GaN layer is clad onto the first GaN crystal nuclei laid with the In atoms.

Optionally, a height of the first GaN crystal nuclei is 8 nm~15 nm.

Optionally, a thickness of the GaN layer is 5 nm~10 nm.

Optionally, the at least one composite layer comprises a first InGaN sublayer, a first GaN sublayer, a second InGaN sublayer and a second GaN sublayer which are successively stacked on the GaN crystal nuclei.

Optionally, thicknesses of the first InGaN sublayer, the first GaN sublayer, the second InGaN sublayer and the second GaN sublayer are reduced in order.

Optionally, the thickness of the first InGaN sublayer is 5 nm~10 nm, the thickness of the first GaN sublayer is 3 nm~8 nm, the thickness of the second InGaN sublayer is 2 nm~5 nm, and the thickness of the second GaN sublayer is 1 nm~4 nm.

Optionally, the epitaxial wafer further comprises an undoped GaN layer, the undoped GaN layer is stacked between the buffer layer and the N-type GaN layer.

In still another aspect, an embodiment of the present disclosure provides a light-emitting diode chip which comprises the epitaxial wafer of any of the foregoing and electrodes on the epitaxial wafer.

The beneficial effects of the technical solution provided by the embodiments of the present disclosure are:

by first forming the GaN crystal nuclei containing the In atoms in the partial region of the sapphire substrate, and utilizing the characteristic of the volume of the In atom larger than that of the Ga atom, the volume of the GaN crystal nuclei may be increased to a certain extent, which facilitates to forma stable GaN crystal nuclei. Furthermore, the GaN crystal nuclei containing the In atoms can attract both the InGaN sublayer and the GaN sublayer in the composite layer to be selectively grow on the GaN crystal nuclei, and the volume of the GaN crystal nuclei is increased further by utilizing the characteristic of the volume of the In atom larger than that of the Ga atom, thereby finally forming a large and stable GaN crystal nuclei. In this case, there may be a relatively suitable distance between two adjacent GaN crystal nuclei, and when the two adjacent GaN crystal nuclei are combined together, the stress generated by lattice mismatch between the sapphire substrate and a GaN-based material can be effectively counteracted, which will avoid producing line defects extending to the active layer, and accordingly facilitate there combination light emission of the electrons and the holes, thus the light-emitting efficiency of LED is improved.

BRIEF DESCRIPTION OF THE DRAWINGS

In order to illustrate the technical solutions in the embodiments of the present disclosure more clearly, the accompanying drawings required in the description of the embodiments will be briefly described below. Apparently, the drawings in the following description are merely some embodiments of present disclosure. For persons of ordinary skill in the art, other drawings may be obtained based on these drawings without any creative efforts.

DETAILED DESCRIPTIONS

Figure 1:
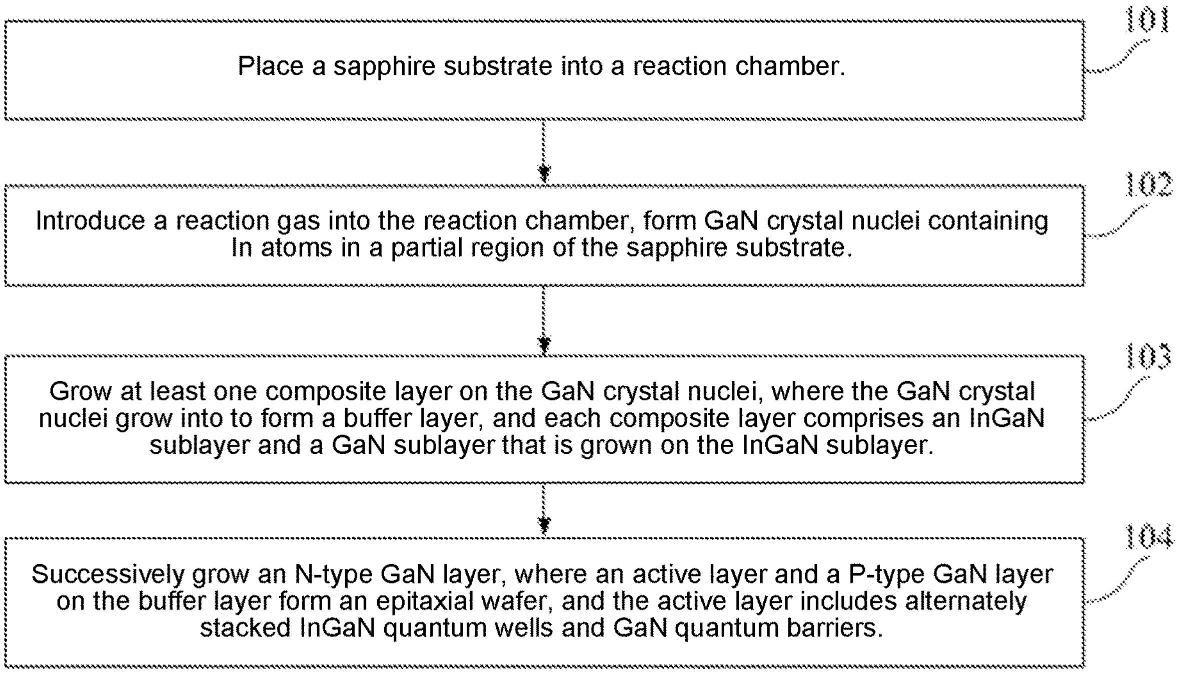
FIG. 1 is a flowchart of a growth method for a light-emitting diode epitaxial wafer provided by an embodiment of the present disclosure.

To make the objectives, technical solutions and advantages of the present disclosure clearer, the following further describes the embodiments of the present disclosure in detail with reference to the accompanying drawings.

In the process of manufacturing an LED, first a semiconductor film is grown on a single crystal material with a matching crystal structure to form an epitaxial wafer; and then electrodes for injecting electrical currents are disposed on the epitaxial wafer to form a chip. In the related art, a LED epitaxial wafer comprises a sapphire substrate and a GaN buffer layer, an N-type GaN layer, an active layer formed by InGaN quantum wells and GaN quantum barriers stacked alternately, and a P-type GaN layer successively stacked on the sapphire substrate.

During the growth of the GaN buffer layer, Ga atoms and N atoms are gradually grown into a plurality of GaN crystal nuclei on the surface of the sapphire substrate, and the plurality of crystal nuclei are arranged on the surface of sapphire substrate at intervals to obtain the buffer layer. The subsequently deposited GaN materials grow laterally between the plurality of the GaN crystal nuclei and join together.

In a case where the distance between the center positions of two adjacent GaN crystal nuclei is constant, if the thickness of the buffer layer is thin and the volume of the GaN crystal nuclei is small, then the distance between the two adjacent GaN crystal nuclei is far apart. When the two adjacent GaN crystal nuclei are combined together, the stress generated by lattice mismatch between the sapphire substrate and a GaN-based material cannot be effectively counteracted, resulting in producing line defects extending to the active layer, which will affect the recombination light emission of electrons and holes, and accordingly reduce light-emitting efficiency of LED. However, if the thickness of the buffer layer is thick and the volume of the GaN crystal nuclei is large, then the crystal structure of the GaN crystal nuclei is unstable. When the two adjacent GaN crystal nuclei are combined together, the stress generated by lattice mismatch between the sapphire substrate and the GaN-based material cannot be effectively counteracted, resulting in producing line defects extending to the active layer, which will affect the recombination light emission of the electrons and the holes, and accordingly reduce light-emitting efficiency of the LED.

Based on the above circumstances, an embodiment of the present disclosure provides a growth method for a light-emitting diode epitaxial wafer. In the growth method, a hydrogen gas, or a nitrogen gas, or a mixed gas of the hydrogen gas and the nitrogen gas is used as a carrier gas, trimethylgallium or triethylgallium is used as a gallium source, a high purity ammonia gas is used as an nitrogen source, trimethylindium is used as an indium source, trimethylaluminum is used as the an aluminum source, silane is used as a silicon source, and magnesocene is used as a magnesium source.

FIG. 1 is a flowchart of a growth method for a light-emitting diode epitaxial wafer provided by an embodiment of the present disclosure. As shown in FIG. 1, the growth method comprises:

Step 101: placing a sapphire substrate into a reaction chamber.

Illustratively, the reaction chamber can be a reaction chamber of a Metal-organic Chemical Vapor Deposition (MOCVD for short) apparatus, such as Veeco K465i MOCVD or Veeco C4 MOCVD.

Optionally, after step 101, the growth method further comprises:

controlling the temperature to be 1000° C.~1100° C. (such as 1050° C.) and the pressure to be 200 torr~500 torr (such as 350 torr), and performing an annealing treatment on the substrate in a hydrogen gas atmosphere for 5~6 minutes (such as 5.5 minutes).

The surface of the substrate is cleaned through the above steps to avoid incorporation of impurities into the epitaxial wafer, which facilitates to improve growth quality of the epitaxial wafer.

Step 102: introducing a reaction gas into the reaction chamber, and forming GaN crystal nuclei containing In atoms in a partial region of the sapphire substrate.

That is, a plurality of spacedly disposed GaN crystal nuclei are formed on the surface of the sapphire substrate. Illustratively, the surface is a surface [0001].

Optionally, the step 102 comprises:

First step, introducing a Ga source and an N source into the reaction chamber, and Ga atoms and N atoms aggregating within the partial region of the sapphire substrate to form a plurality of first GaN crystal nuclei arranged at intervals.

Figure 2:
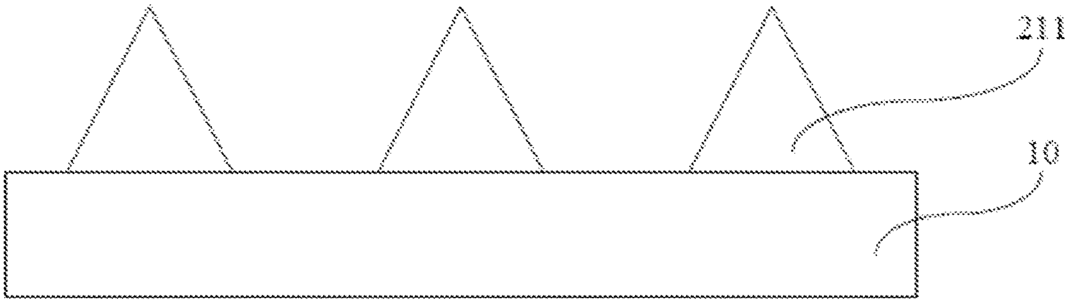
FIG. 2 is a schematic structural diagram of a light-emitting diode epitaxial wafer after a first step is performed according to an embodiment of the present disclosure.

FIG. 2 is a schematic structural diagram of a light-emitting diode epitaxial wafer after the first step is performed according to an embodiment of the present disclosure, of which, 10 denotes a sapphire substrate and 211 denotes a first GaN crystal nuclei. Referring to FIG. 2, a plurality of the first GaN crystal nuclei 211 are arranged on the same surface of the sapphire substrate 10 at intervals.

In practical applications, the Ga source and the N source are introduced into the reaction chamber, and the Ga atoms and the N atoms are adsorbed on the sapphire substrate and aggregated within the partial region of the sapphire substrate, and then the first GaN crystal nuclei is formed.

Second step, introducing an In source into the reaction chamber, and In atoms being adsorbed on the first GaN crystal nuclei such that the first GaN crystal nuclei is enlarged to be second GaN crystal nuclei.

Figure 3:
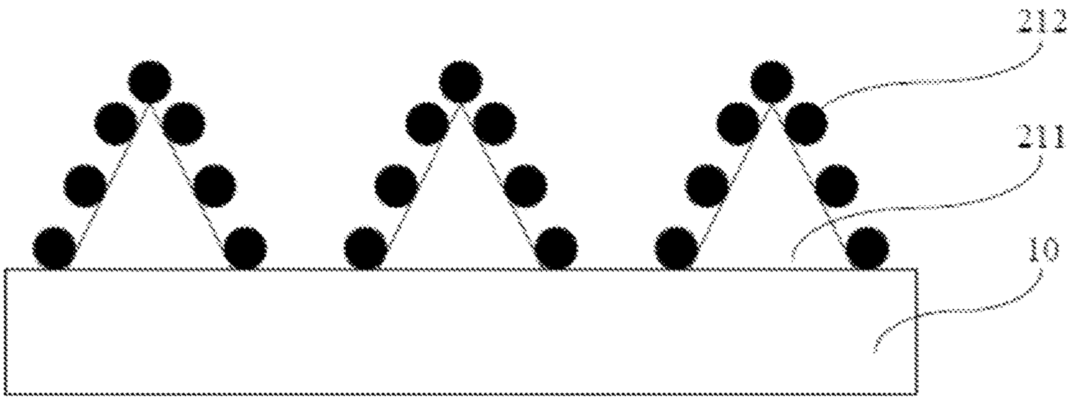
FIG. 3 is a schematic structural diagram of a light-emitting diode epitaxial wafer after a second step is performed according to an embodiment of the present disclosure.

FIG. 3 is a schematic structural diagram of a light-emitting diode epitaxial wafer after the second step is performed according to an embodiment of the present disclosure, of which, 10 denotes a sapphire substrate, 211 denotes a first GaN crystal nuclei, and 212 denotes In atoms. Referring to FIG. 3, a plurality of the first GaN crystal nuclei 211 are arranged on the same surface of the sapphire substrate 10 at intervals, a plurality of the In atoms 212 are laid on the plurality of the first GaN crystal nuclei 211, and each first GaN crystal nuclei 211 is laid with a plurality of the In atoms 212.

In practical applications, the In source is introduced into the reaction chamber, and the In atoms are adsorbed on the first GaN crystal nuclei and form chemical bonds with the first GaN crystal nuclei. Therefore, the volume of the first GaN crystal nuclei is increased and becomes the second GaN crystal nuclei.

Third step, introducing the Ga source and the N source into the reaction chamber, and the GaN layer generated by the reaction of Ga atom and N atom being clad onto the second GaN crystal nuclei to form the GaN crystal nuclei containing In atoms.

Figure 4:
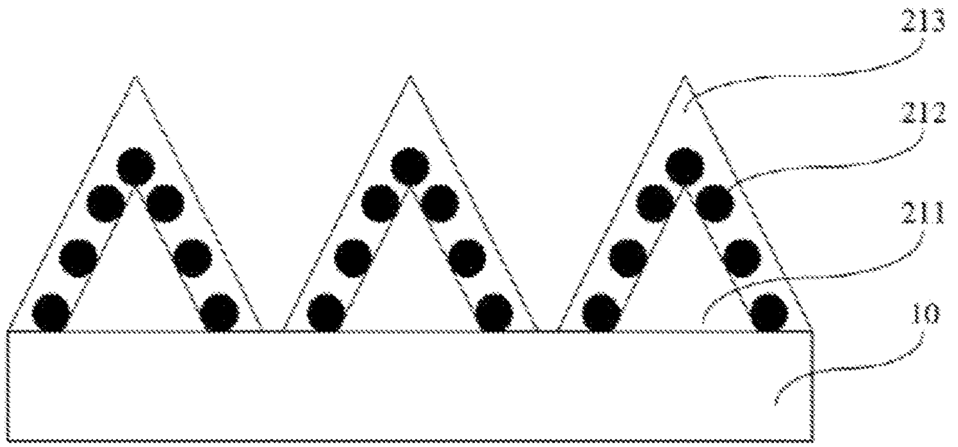
FIG. 4 is a schematic structural diagram of a light-emitting diode epitaxial wafer after a third step is performed according to an embodiment of the present disclosure.

FIG. 4 is a schematic structural diagram of a light-emitting diode epitaxial wafer after the third step is performed according to an embodiment of the present disclosure, of which, 10 denotes a sapphire substrate, 211 denotes a first GaN crystal nuclei, 212 denotes In atoms, and 213 denotes a GaN layer. Referring to FIG. 4, a plurality of the first GaN crystal nuclei 211 are arranged on the same surface of the sapphire substrate 10 at intervals, a plurality of the In atoms 212 are laid on the plurality of the first GaN crystal nuclei 211, the GaN layer 213 is clad on the In atoms 212 on each first GaN crystal nuclei 211 and confines the In atoms 212 in the GaN crystal nuclei together with the first GaN crystal nuclei 211.

In practical applications, the Ga source and the N source are introduced into the reaction chamber, and the GaN layer generated by the reaction of the Ga atoms and the N atoms is covered on the In atoms and the first GaN crystal nuclei around the In atoms, and confines the In atoms in the GaN crystal nuclei together with the first GaN crystal nuclei to form the GaN crystal nuclei containing the In atoms.

In the embodiment of the present disclosure, by introducing the Ga source and the N source into the reaction chamber first, the Ga atoms and the N atoms can be aggregated within the partial region of the sapphire substrate to form the plurality of the first GaN crystal nuclei, thus crystal seeds are seeded on the sapphire substrate and a base structure of the GaN crystal nuclei is established. Then, the In source is introduced into the reaction chamber, making the In atoms adsorbed on the first GaN crystal nuclei and the first GaN crystal nuclei enlarged to be the second GaN crystal nuclei, which allows the In atoms to be incorporated into the GaN crystal nuclei without destroying the base structure of the GaN crystal nuclei, and makes the volume of the GaN crystal nuclei to be increased. Finally, the Ga source and the N source are introduced into the reaction chamber, making the GaN layer generated by the reaction of Ga atoms and N atoms clad onto the second GaN crystal nuclei and confining the In atoms in the GaN crystal nuclei to ensure the stability of the GaN crystal nuclei.

Illustratively, the height of the first GaN crystal nuclei is 8 nm~15 nm. The height here refers to the maximum distance from the outer surface of the first GaN crystal nuclei to the surface of the sapphire substrate where it is located.

If the height of the first GaN crystal nuclei is less than 8 nm, the structure of the crystal seeds may not be fully built up, and accordingly the first GaN crystal nuclei has poor stability, which affects the establishment of the base structure of the GaN crystal nuclei, causing the instability of the finally formed GaN crystal nuclei. Accordingly, when the two adjacent GaN crystal nuclei are combined together, the stress generated by lattice mismatch between the sapphire substrate and the GaN-based material cannot be effectively counteracted, resulting in producing line defects extending to the active layer, which will affect the recombination light emission of electrons and holes, and reduce light-emitting efficiency of LED. If the height of the first GaN crystal nuclei is greater than 15 nm, the growth time will be longer and the production efficiency will be affected.

For instance, the height of the first GaN crystal nuclei is 8 nm~12 nm, such as 10 nm.

Illustratively, in forming the second GaN crystal nuclei, the duration time for introducing the In source is 10 s~50 s.

If the duration for introducing the In source in forming the second GaN crystal nuclei is less than 10 s, less In source is introduced in forming the second GaN crystal nuclei, and the In atoms may be not spread over the entire surface of the GaN crystal nuclei, thereby affecting the formation of the InGaN sublayer in this area; If the duration for introducing the In source in forming the second GaN crystal nuclei is longer than 50 s, more In source is introduced in forming the second GaN crystal nuclei, which, on the one hand, may cause the volume of the GaN crystal nuclei to be too large, thus precluding to take advantage of the benefit of utilizing the combination of two adjacent GaN crystal nuclei to effectively counteract the stress generated by lattice mismatch between the sapphire substrate and the GaN-based material, and on the other hand, may affect the crystal structure of the GaN crystal nuclei, resulting in a poor overall quality of the epitaxial wafer, and thus affecting the recombination light emission of the electrons and the holes, and accordingly reducing light-emitting efficiency of LED.

For instance, the duration for introducing the In source in forming the second GaN crystal nuclei is 20 s~40 s, such as 30 s.

Illustratively, the thickness of the GaN layer is 5 nm~10 nm.

If the thickness of the GaN layer is less than 5 nm, the GaN layer may not be able to completely clad on the In atoms, causing the instability of the GaN crystal nuclei. When the two adjacent GaN crystal nuclei are combined together, the stress generated by lattice mismatch between the sapphire substrate and the GaN-based material cannot be effectively counteracted, resulting in producing line defects extending to the active layer, which will affect the recombination light emission of electrons and holes, and accordingly reduce light-emitting efficiency of LED. If the thickness of the GaN layer is greater than 15 nm, the growth time will be longer and the production efficiency will be affected.

For instance, the thickness of GaN layer is 5 nm~8 nm, such as 8 nm.

Illustratively, in forming the GaN crystal nuclei, a temperature in the reaction chamber is 530° C.~560° C., such as 545° C.; and a pressure thereof is 200 torr 500 torr, such as 350 torr.

Step 103: growing at least one composite layer on the GaN crystal nuclei, the GaN crystal nuclei growing to form a buffer layer, and each composite layer comprising an InGaN sublayer and a GaN sublayer that is grown on the InGaN sublayer.

Optionally, the step 103 comprises:

introducing an In source, a Ga source and an N source into the reaction chamber, and a first InGaN sublayer generated by the reaction of In atoms, Ga atoms and N atoms being clad onto the GaN crystal nuclei;

introducing the Ga source and the N source into the reaction chamber, and a first GaN sublayer generated by the reaction of Ga atoms and N atoms being clad onto the first InGaN sublayer;

introducing the In source, the Ga source and the N source into the reaction chamber, and a second InGaN sublayer generated by the reaction of In atoms, Ga atoms and N atoms being clad onto the first GaN sublayer;

introducing the Ga source and the N source into the reaction chamber, and a second GaN sublayer generated by the reaction of Ga atoms and N atoms being clad onto the second InGaN sublayer.

In the embodiment of the present disclosure, the first InGaN sublayer, the first GaN sublayer, the second InGaN sublayer and the second GaN sublayer are successively grown on the GaN crystal nuclei, and the InGaN sublayers and the GaN sublayers are alternately stacked, which not only enables to utilize the characteristic of the volume of the In atom larger than that of the Ga atom to increase the volume of the GaN crystal nuclei, but also helps to maintain the main structure of the GaN crystal nuclei unchanged, thereby finally forming a large and stable GaN crystal nuclei. In this case, there may be a relatively suitable distance between two adjacent GaN crystal nuclei, and accordingly when the two adjacent GaN crystal nuclei are combined together, the stress generated by lattice mismatch between the sapphire substrate and the GaN-based material can be effectively counteracted, which will avoid producing line defects extending to the active layer, and facilitate the recombination light emission of the electrons and the holes, thus the light-emitting efficiency of LED is improved.

In the foregoing implementations, thicknesses of the first InGaN sublayer, the first GaN sublayer, the second InGaN sublayer and the second GaN sublayer are reduced in order.

In the case of the GaN crystal nuclei being stabilized more and more, a gradually reduced thicknesses of semiconductor layers help to minimize the growth time and to improve the growth efficiency as much as possible.

Illustratively, the thickness of the first InGaN sub layer is 5 nm~10 nm.

If the thickness of the first InGaN sublayer is less than 5 nm, there has been a possibility that the volume of the GaN crystal nuclei may not be effectively increased as the first InGaN sublayer is too thin, thus when the two adjacent GaN crystal nuclei are combined together, the stress generated by lattice mismatch between the sapphire substrate and the GaN-based material cannot be effectively counteracted. If the thickness of the first InGaN sublayer is greater than 10 nm, the crystal structure of GaN may be affected because of the first InGaN sublayer being too thick, resulting in a poor overall crystal quality of the epitaxial wafer, and thus affecting the recombination light emission of the electrons and the holes, and accordingly reducing light-emitting efficiency of LED.

For instance, the thickness of the first InGaN sublayer is 6 nm~10 nm, such as 8 nm.

Illustratively, the thickness of the first GaN sublayer is 3 nm~8 nm.

If the thickness of the first GaN sublayer is less than 3 nm, the crystal structure of GaN may be affected because of the first GaN sublayer being too thin, resulting in a poor overall crystal quality of the epitaxial wafer, and thus affecting the recombination light emission of the electrons and the holes, and accordingly reducing light-emitting efficiency of LED. If the thickness of the first GaN sublayer is greater than 8 nm, the absorption of light may be increased because of the first GaN sublayer being too thick, thus affecting light extraction efficiency of LED.

For instance, the thickness of the first GaN sublayer is 3 nm~6 nm, such as 5 nm.

Illustratively, the thickness of the second InGaN sublayer is 2 nm~5 nm.

If the thickness of the second InGaN sublayer is less than 2 nm, there has been a possibility that the volume of the GaN crystal nuclei may not be effectively increased as the second InGaN sublayer is too thin, thus when the two adjacent GaN crystal nuclei are combined together, the stress generated by lattice mismatch between the sapphire substrate and the GaN-based material cannot be effectively counteracted. If the thickness of the second InGaN sublayer is greater than 5 nm, the crystal structure of GaN may be affected because of the second InGaN sublayer being too thick, resulting in a poor overall crystal quality of the epitaxial wafer, and thus affecting the recombination light emission of the electrons and the holes, and accordingly reducing light-emitting efficiency of LED.

For instance, the thickness of the second InGaN sublayer is 1 nm~5 nm, such as 3 nm.

Illustratively, the thickness of the second GaN sublayer is 1 nm~4 nm.

If the thickness of the second GaN sublayer is less than 1 nm, the crystal structure of GaN may be affected because of the second GaN sublayer being too thin, resulting in a poor overall crystal quality of the epitaxial wafer, and thus affecting the recombination light emission of the electrons and the holes, and accordingly reducing light-emitting efficiency of LED. If the thickness of the second GaN sublayer is greater than 4 nm, the absorption of light may be increased because of the second GaN sublayer being too thick, thus affecting light extraction efficiency of LED.

For instance, the thickness of the second GaN sublayer is 1.5 nm~4 nm, such as 2 nm.

Illustratively, in generating the first InGaN sublayer and the second InGaN sublayer, flow rates of the In sources introduced are 50 sccm 500 sccm.

If the flow rates of the In sources introduced in generating the first InGaN sublayer and the second InGaN sublayer are less than 50 sccm, there has been a possibility that the volume of the GaN crystal nuclei may not be effectively increased as the flow rates of the In sources introduced in generating the first InGaN sublayer and the second InGaN sublayer are too low, thus when the two adjacent GaN crystal nuclei are combined together, the stress generated by lattice mismatch between the sapphire substrate and the GaN-based material cannot be effectively counteracted. If the flow rates of the In sources introduced in generating the first InGaN sublayer and the second InGaN sublayer are greater than 500 sccm, the epitaxial wafer may has a poor overall crystal quality because of the flow rates of the In sources introduced in generating the first InGaN sublayer and the second InGaN sublayer being too great, thus affecting the recombination light emission of the electrons and the holes, and accordingly reducing light-emitting efficiency of LED.

For instance, the flow rates of the In sources introduced in generating the first InGaN sublayer and the second InGaN sublayer are 100 sccm 500 sccm, such as 300 sccm.

Illustratively, in growing the composite layer, a temperature in the reaction chamber is 530° C.~560° C., such as 545° C.; and a pressure thereof is 200 torr 500 torr, such as 350 torr.

Step 104: successively growing an N-type GaN layer, an active layer and a P-type GaN layer on the buffer layer to form an epitaxial wafer, the active layer comprising alternately stacked InGaN quantum wells and GaN quantum barriers.

By first forming the GaN crystal nuclei containing the In atoms in the partial region of the sapphire substrate, and utilizing the characteristic of the volume of the In atom larger than that of the Ga atom, the volume of the GaN crystal nuclei may be increased to a certain extent, which facilitates to form a stable GaN crystal nuclei. Furthermore, the GaN crystal nuclei containing the In atoms can attract both the InGaN sublayer and the GaN sublayer in the composite layer to be selectively grow on the GaN crystal nuclei, and the volume of the GaN crystal nuclei is increased further by utilizing the characteristic of the volume of the In atom larger than that of the Ga atom, thereby finally forming a large and stable GaN crystal nuclei. In this case, there may be a relatively suitable distance between two adjacent GaN crystal nuclei, and when the two adjacent GaN crystal nuclei are combined together, the stress generated by lattice mismatch between the sapphire substrate and the GaN-based material can be effectively counteracted, which will avoid producing line defects extending to the active layer, and accordingly facilitate there combination light emission of the electrons and the holes, thus the light-emitting efficiency of LED is improved.

Optionally, in growing the N-type GaN layer, a temperature in the reaction chamber is 1000° C.~1100° C., such as 1050° C.; and a pressure thereof is 200 torr 300 torr, such as 250 torr.

In growing the InGaN quantum well, a temperature in the reaction chamber is 760° C.~780° C., such as 770° C.; and a pressure thereof is 200 torr.

In growing the GaN quantum barrier, a temperature in the reaction chamber is 860° C.~890° C., such as 875° C.; and a pressure thereof is 200 torr.

In growing the P-type GaN layer, the temperature in the reaction chamber is 940° C.~980° C., such as 960° C.; a pressure thereof is 200 torr 600 torr, such as 400 torr.

Illustratively, the thickness of the N-type GaN layer is 2 μm~3 such as 2.5 μm; and the dopant concentration of N-type dopant in the N-type GaN layer is $10^{18}/cm^3$~$10^{20}/cm^3$, such as $10^{19}/cm^3$. The thickness of the InGaN quantum well is 2 nm~3 nm, such as 2.5 nm, the number of the InGaN quantum wells is 11~13, such as 12. The thickness of the GaN quantum barrier is 8 nm~11 nm, such as 9.5 nm, the number of quantum barriers is 11~13, such as 12. The thickness of the P-type GaN layer is 50 nm~80 nm, such as 65 nm, and the dopant concentration of P-type dopant in the P-type GaN layer is $10^{18}/cm^3$~$10^{20}/cm^3$, such as $10^{19}/cm^3$.

Optionally, before step 104, the method further comprises:

growing an undoped GaN layer on the buffer layer.

Accordingly, the N-type GaN layer, the active layer and the P-type GaN layer are successively grown on the buffer layer.

In this case, the undoped GaN layer are laterally grown and merged between the GaN crystal nuclei, which can reduce impurities in a formed growth plane, and accordingly facilitate to promote the growth quality of the active layer, thus the light-emitting efficiency of LED is improved Illustratively, in growing the undoped GaN layer, a temperature in the reaction chamber is 1000° C.~1100° C., such as 1050° C.; and a pressure thereof is 200 torr 600 torr, such as 400 torr.

Illustratively, the thickness of the undoped GaN layer can be 2 μm~3.5 μm, such as 2.75 μm.

Optionally, the method further comprises:

growing an electron blocking layer on the active layer.

By adding the electron blocking layer, electron transition to the P-type GaN layer can be avoided, which facilitates there combination light emission of the electrons and the holes in the active layer, thus the light-emitting efficiency of LED is improved.

Illustratively, in growing the electron blocking layer, a temperature in the reaction chamber is 930° C.~970° C., such as 950° C., and a pressure thereof is 100 torr.

Illustratively, the material of the electronic blocking layer is an $Al_xGa_{1-x}N$ layer doped with Mg, $0.15 \le x \le 0.25$. The thickness of the electron blocking layer is 30 nm 50 nm, such as 40 nm.

Figure 5:
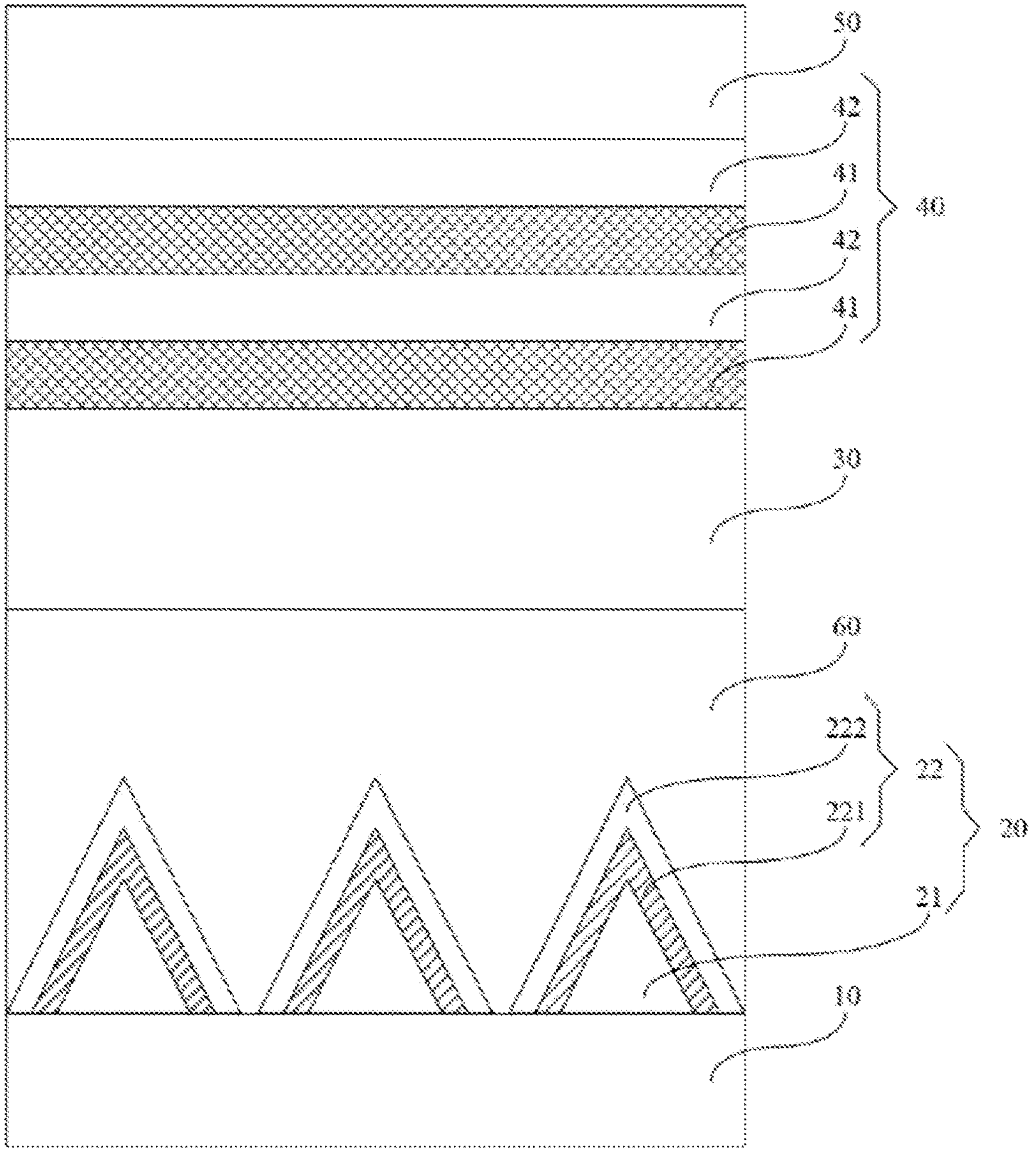
FIG. 5 is a schematic structural diagram of a light-emitting diode epitaxial wafer provided by an embodiment of the present disclosure.

The embodiment of the present disclosure provides a light-emitting diode epitaxial wafer, which can be formed by the growth method shown in FIG. 1. FIG. 5 is a schematic structural diagram of a light-emitting diode epitaxial wafer provided by an embodiment of the present disclosure. Referring to FIG. 5, the light-emitting diode epitaxial wafer comprises a sapphire substrate 10, and a buffer layer 20, an N-type GaN layer 30, an active layer 40 and a P-type GaN layer 50 successively stacked on the sapphire substrate 10. The active layer 40 comprises alternately stacked InGaN quantum wells 41 and GaN quantum barriers 42. The buffer layer 20 comprises a plurality of GaN crystal nuclei 21 containing In atoms and at least one composite layer 22. The plurality of the GaN crystal nuclei 21 are located in a partial region of the sapphire substrate, that is, a plurality of GaN crystal nuclei 21 are arranged on the surface of the sapphire substrate at intervals. The at least one composite layer 22 is located on the plurality of the GaN crystal nuclei 21, and each composite layer 22 comprises an InGaN sublayer 221 and a GaN sublayer 222 grown on the InGaN sublayer 221.

By first forming the GaN crystal nuclei containing the In atoms in the partial region of the sapphire substrate, and utilizing the characteristic of the volume of the In atom larger than that of the Ga atom, the volume of the GaN crystal nuclei may be increased to a certain extent, which facilitates to form a stable GaN crystal nuclei. Furthermore, the GaN crystal nuclei containing the In atoms can attract both the InGaN sublayer and the GaN sublayer in the composite layer to be selectively grow on the GaN crystal nuclei, and the volume of the GaN crystal nuclei is increased further by utilizing the characteristic of the volume of the In atom larger than that of the Ga atom, thereby finally forming a large and stable GaN crystal nuclei. When the two adjacent GaN crystal nuclei are combined together, the stress generated by lattice mismatch between the sapphire substrate and a GaN-based material can be effectively counteracted, which will avoid producing line defects extending to the active layer, and accordingly facilitate there combination light emission of the electrons and the holes, thus the light-emitting efficiency of LED is improved.

In addition, in forming the GaN crystal nuclei, a temperature in the reaction chamber is set to 530° C.~560° C. and the pressure thereof is set at 200 torr~500 torr, which makes the distance between two adjacent GaN crystal nuclei relatively suitable, thereby helping to better counteract the stress generated by lattice mismatch between the sapphire substrate and the GaN-based material, and accordingly enabling a further reduction of line defects.

Optionally, the GaN crystal nuclei 21 comprises a first GaN crystal nuclei, the In atoms and a GaN layer. The In atoms are laid on the first GaN crystal nuclei, and the GaN layer is clad onto the first GaN crystal nuclei laid with the In atoms.

Optionally, a height of the first GaN crystal nuclei is 8 nm~15 nm.

Optionally, a thickness of the GaN layer is 5 nm~10 nm.

Optionally, the number of the composite layers 22 is two, and the two composite layers comprise a first InGaN sublayer, a first GaN sublayer, a second InGaN sublayer and a second GaN sublayer that are successively stacked on the GaN crystal nuclei.

Optionally, thicknesses of the first InGaN sublayer, the first GaN sublayer, the second InGaN sublayer and the second GaN sublayer are reduced in order.

Optionally, the thickness of the first InGaN sublayer is 5 nm~10 nm, the thickness of the first GaN sublayer is 3 nm~8 nm, the thickness of the second InGaN sublayer is 2 nm~5 nm, and the thickness of the second GaN sublayer is 1 nm~4 nm.

Optionally, the light-emitting diode epitaxial wafer further comprises an undoped GaN layer 60, which is stacked between the buffer layer 20 and the N-type GaN layer 30.

It should be noted that the buffer layer in the embodiments of the present disclosure is also referred to as a low temperature buffer layer, and the undoped GaN layer 60 is also referred to as a high temperature buffer layer.

The embodiment of the present disclosure also provides a light-emitting diode chip, which comprises an epitaxial wafer shown in FIG. 5 and electrodes on the epitaxial wafer. The electrodes comprises an N electrode connected with the N-type GaN layer and a P electrode connected with the P-type GaN layer.

The above are only optional embodiments of the present disclosure, and are not intended to limit the present disclosure. Any modification, equivalent replacement, improvements, etc. made within the spirit and principle of the present disclosure may fall within the protection scope of the present disclosure.

What is claimed is:

1. A growth method for a light-emitting diode epitaxial wafer, comprising:

placing a sapphire substrate into a reaction chamber;

introducing reaction gases into the reaction chamber, and forming a plurality of GaN crystal nuclei, containing In atoms, on a surface of the sapphire substrate, wherein the introducing comprises:

introducing a Ga gas and an N gas into the reaction chamber such that Ga atoms and N atoms aggregate within a partial region of the sapphire substrate to form a plurality of first GaN crystal nuclei arranged at intervals;

introducing an In gas comprising the In atoms into the reaction chamber, where the In atoms are adsorbed on the plurality of first GaN crystal nuclei to form a plurality of second GaN crystal nuclei;

introducing the Ga gas and the N gas into the reaction chamber such that Ga atoms and N atoms clad onto the second GaN crystal nuclei to form the plurality of GaN crystal nuclei;

growing at least one composite layer on the plurality of GaN crystal nuclei, the GaN crystal nuclei growing to form a buffer layer, and each composite layer comprising an InGaN sublayer and a GaN sublayer that is grown on the InGaN sublayer; and successively growing an N-type GaN layer, an active layer and a P-type GaN layer on the buffer layer to form an epitaxial wafer, the active layer comprising alternately stacked InGaN quantum wells and GaN quantum barriers.

2. The growth method according to claim 1, wherein a height of the first GaN crystal nuclei is 8 nm~15 nm.

3. The growth method according to claim 1, wherein in forming the second GaN crystal nuclei, a duration time for introducing an In source is 10 s~50 s.

4. The growth method according to claim 1, wherein a thickness of the GaN layer is 5 nm~10 nm.

5. The growth method according to claim 1, wherein the step of growing the at least one composite layer on the GaN crystal nuclei comprises:

introducing an In source, a Ga source and an N source into the reaction chamber, and a first InGaN sublayer generated by reaction of In atoms, Ga atoms and N atoms being clad onto the GaN crystal nuclei;

introducing the Ga source and the N source into the reaction chamber, and a first GaN sublayer generated by reaction of Ga atoms and N atoms being clad onto the first InGaN sublayer;

introducing the In source, the Ga source and the N source into the reaction chamber, and a second InGaN sublayer generated by reaction of In atoms, Ga atoms and N atoms being clad onto the first GaN sublayer;

introducing the Ga source and the N source into the reaction chamber, and a second GaN sublayer generated by reaction of Ga atoms and N atoms being clad onto the second InGaN sublayer.

6. The growth method according to claim 5, wherein thicknesses of the first InGaN sublayer, the first GaN sublayer, the second InGaN sublayer, and the second GaN sublayer are reduced in order.

7. The growth method according to claim 5, wherein a thickness of the first InGaN sublayer is 5 nm~10 nm, a thickness of the first GaN sublayer is 3 nm~8 nm, a thickness of the second InGaN sublayer is 2 nm~5 nm, and a thickness of the second GaN sublayer is 1 nm~4 nm.

8. The growth method according to claim 5, wherein in generating the first InGaN sublayer and the second InGaN sublayer, flow rates of the In source introduced are 50 sccm~500 sccm.

9. The growth method according to claim 1, further comprising:

before growing the N-type GaN layer on the buffer layer, growing an undoped GaN layer on the buffer layer.

10. An epitaxial wafer, comprising:

a sapphire substrate, and a buffer layer, an N-type GaN layer, an active layer and a P-type GaN layer successively stacked on the sapphire substrate, and the active layer comprising alternately stacked InGaN quantum wells and GaN quantum barriers;

wherein the buffer layer comprises a plurality of GaN crystal nuclei containing In atoms and at least one composite layer, and the plurality of GaN crystal nuclei are arranged on a surface of the sapphire substrate at intervals, the at least one composite layer is located on the plurality of GaN crystal nuclei, and each composite layer comprises an InGaN sublayer and a GaN sublayer grown on the InGaN sublayer, wherein the GaN crystal nuclei include first GaN crystal nuclei, the In atoms and a GaN layer, the In atoms are laid on the first GaN crystal nuclei, and the GaN layer is clad onto the first GaN crystal nuclei laid with the In atoms; and wherein a height of the first GaN crystal nuclei is 8 nm~15 nm.

11. The epitaxial wafer according to claim 10, wherein a thickness of the GaN layer is 5 nm~10 nm.

12. The epitaxial wafer according to claim 10, wherein the at least one composite layer comprises a first InGaN sublayer, a first GaN sublayer, a second InGaN sublayer and a second GaN sublayer which are successively stacked on the GaN crystal nuclei.

13. The epitaxial wafer according to claim 12, wherein thicknesses of the first InGaN sublayer, the first GaN sublayer, the second InGaN sublayer and the second GaN sublayer are reduced in order.

14. The epitaxial wafer according to claim 13, wherein a thickness of the first InGaN sublayer is 5 nm~10 nm, a thickness of the first GaN sublayer is 3 nm~8 nm, a thickness of the second InGaN sublayer is 2 nm~5 nm, and a thickness of the second GaN sublayer is 1 nm~4 nm.

15. The epitaxial wafer according to claim 10, further comprising:

an undoped GaN layer, the undoped GaN layer is stacked between the buffer layer and the N-type GaN layer.

16. A light-emitting diode chip, comprising:

an epitaxial wafer, further including a sapphire substrate, and a buffer layer, an N-type GaN layer, an active layer and a P-type GaN layer successively stacked on the sapphire substrate, the active layer comprising alternately stacked InGaN quantum wells and GaN quantum barriers; and one or more electrodes on the epitaxial wafer;

wherein the buffer layer comprises a plurality of GaN crystal nuclei containing In atoms and at least one composite layer, and the plurality of GaN crystal nuclei are arranged on a surface of the sapphire substrate at intervals, the at least one composite layer is located on the plurality of GaN crystal nuclei, and each composite layer comprises an InGaN sublayer and a GaN sublayer grown on the InGaN sublayer, wherein the GaN crystal nuclei include first GaN crystal nuclei, the In atoms and a GaN layer, the In atoms are laid on the first GaN crystal nuclei, and the GaN layer is clad onto the first GaN crystal nuclei laid with the In atoms; and wherein a height of the first GaN crystal nuclei is 8 nm~15 nm.

17. The light-emitting diode chip according to claim 16, wherein:

the GaN crystal nuclei include a first GaN crystal nuclei, the In atoms and a GaN layer; the In atoms are laid on the first GaN crystal nuclei; and the GaN layer is clad onto the first GaN crystal nuclei laid with the In atoms.

18. The light-emitting diode chip according to claim 16, wherein a thickness of the GaN layer is 5 nm~10 nm.

19. The light-emitting diode chip according to claim 16, wherein the at least one composite layer comprises a first InGaN sublayer, a first GaN sublayer, a second InGaN sublayer and a second GaN sublayer which are successively stacked on the GaN crystal nuclei.

20. The light-emitting diode chip according to claim 19, wherein thicknesses of the first InGaN sublayer, the first GaN sublayer, the second InGaN sublayer and the second GaN sublayer are reduced in order.

* * * * *